(12) United States Patent
Kennedy et al.

(10) Patent No.: US 11,054,031 B2
(45) Date of Patent: Jul. 6, 2021

(54) SLIDING ELEMENT, IN PARTICULAR PISTON RING

(71) Applicant: FEDERAL-MOGUL BURSCHEID GMBH, Burscheid (DE)

(72) Inventors: Marcus Kennedy, Dusseldorf (DE); Yuriy Ivanov, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 24 days.

(21) Appl. No.: 16/095,775

(22) PCT Filed: Apr. 28, 2017

(86) PCT No.: PCT/EP2017/060200
§ 371 (c)(1),
(2) Date: Oct. 23, 2018

(87) PCT Pub. No.: WO2017/186915
PCT Pub. Date: Nov. 2, 2017

(65) Prior Publication Data
US 2019/0128420 A1   May 2, 2019

(30) Foreign Application Priority Data
Apr. 28, 2016   (DE) ...................... 10 2016 107 874.3

(51) Int. Cl.
*F16J 9/26*    (2006.01)
*C23C 14/02*   (2006.01)
(Continued)

(52) U.S. Cl.
CPC ............... *F16J 9/26* (2013.01); *C23C 14/025* (2013.01); *C23C 14/0605* (2013.01);
(Continued)

(58) Field of Classification Search
CPC .. F16J 9/26; C23C 124/025; C23C 124/0605; C23C 124/0635
(Continued)

(56) References Cited

U.S. PATENT DOCUMENTS

2003/0129407 A1   7/2003   Teer et al.
2005/0100701 A1   5/2005   Hamada et al.
(Continued)

FOREIGN PATENT DOCUMENTS

CN          1827845 A      9/2006
DE    102008016864 B3    10/2009
(Continued)

OTHER PUBLICATIONS

International Search Report, dated Aug. 4, 2017 (PCT/EP2017/060200).
(Continued)

*Primary Examiner* — Archene A Turner
(74) *Attorney, Agent, or Firm* — Robert L. Stearns; Dickinson Wright, PLLC

(57) ABSTRACT

A sliding element, in particular a piston ring, has a coating which has the following layers from the inside outwards: a polycrystalline, metal-containing adhesive layer, an intermediate layer, and at least one amorphous carbon layer, the intermediate layer having the following partial layers from the inside outward: an AxCy layer, with c standing for carbon, A standing for a metal, preferably of the metal-containing adhesive layer, and x as well as y each comprising values of 1-99, and a crystalline-containing or crystal-containing carbon layer.

19 Claims, 1 Drawing Sheet

(51) Int. Cl.
*C23C 14/06* (2006.01)
*C23C 14/32* (2006.01)
*C23C 28/00* (2006.01)

(52) U.S. Cl.
CPC ........ *C23C 14/0635* (2013.01); *C23C 14/325* (2013.01); *C23C 28/322* (2013.01); *C23C 28/341* (2013.01); *C23C 28/343* (2013.01); *C23C 28/347* (2013.01)

(58) Field of Classification Search
USPC .......................... 277/442; 428/336, 408, 469
See application file for complete search history.

(56) References Cited

U.S. PATENT DOCUMENTS

| | | | |
|---|---|---|---|
| 2007/0224349 | A1 | 9/2007 | Hosenfeldt et al. |
| 2011/0101620 | A1 | 5/2011 | Hoppe et al. |
| 2011/0195265 | A1* | 8/2011 | Oohira .................. C23C 28/322 428/217 |
| 2012/0205875 | A1 | 8/2012 | Kennedy et al. |
| 2013/0136861 | A1 | 5/2013 | Barenreuter et al. |
| 2014/0323368 | A1 | 10/2014 | Avelar Araujo et al. |
| 2015/0132539 | A1 | 5/2015 | Bailey et al. |
| 2015/0267746 | A1 | 9/2015 | Okuyama et al. |
| 2016/0341312 | A1 | 11/2016 | Kennedy et al. |

FOREIGN PATENT DOCUMENTS

| | | |
|---|---|---|
| DE | 102008062220 A1 | 6/2010 |
| DE | 10200928504 B3 | 1/2011 |
| DE | 102010002687 A1 | 9/2011 |
| EP | 1036208 B1 | 1/2005 |
| EP | 1990564 A1 | 11/2008 |
| JP | 2004137541 A | 5/2004 |
| JP | 2006177499 A | 7/2006 |
| JP | 2011-225982 * | 11/2011 |
| JP | 2015193918 A | 11/2015 |
| WO | 2013156107 A1 | 10/2013 |
| WO | 2015106884 A1 | 7/2015 |

OTHER PUBLICATIONS

Voevodin A A et al: "Design of a Ti/TiC/DLC functionally gradient coating based on studies of structural transitions in Ti—C thin films", Thin Solid Films, Elsevier, Amsterdam, NL, vol. 298, No. 1-2, Apr. 20, 1997 (Apr. 20, 1997), pp. 107-115, XP004125924, ISSN: 0040-6090, DOI: 10.1016/S0040-6090(96)09145-6 (p. 113, right-hand column p. 110, right-hand column; figure 5 paragraph [02.1]; figure 5 p. 111, left-hand column p. 113, left-hand column; Figure 9).

Vetter, "60 years of DLC coatings: Historical highlights and technical review of cathodic arc processes to synthesize various DLC types, and their evolution for industrial applications" Surface & Coatings Technology, vol. 257, Oct. 25, 2014; pp. 213-240.

Pharr et al., "Hardness, elastic modulus, and structure of very hard carbon films produced by cathodic-arc deposition with substrate pulse biasing" Appl. Phys. Lett., Feb. 5, 1996, pp. 779-791.

* cited by examiner

SLIDING ELEMENT, IN PARTICULAR PISTON RING

BACKGROUND

Technical Field

The invention relates to a sliding element, in particular a piston ring, having a coating.

Related Art

For piston rings which are exposed to temperatures of partly more than 300° C. and are to have the lowest possible coefficient of friction for as long as possible, it is known to provide layer systems which have an adhesive layer, one or more DLC layers as well as, optionally, intermediate layers.

An alternative approach is taught by DE 10 2008 042 896 A1, which discloses a method for coating a sliding element, in particular a piston ring or a cylinder liner of an internal combustion engine, in which DLC phases are embedded in the hard material layer during the deposition of a hard material layer.

An overview of the different DLC layer types and their properties can be found in the VDI Guideline 2840. For example, the following values for the maximum thermal stability are provided here:

| Layer type | Maximum thermal stability |
|---|---|
| a-C | 450° C. |
| ta-C | 500° C. |
| a-C:H | 400° C. |
| ta-C:H | 500° C. |
| a-C:Me (Me = W, Ti . . .) | 400-600° C. |
| a-C:H:Me (Me = W, Ti . . .) | 350-500° C. |

It is thereby known that the thermal stability and the adhesion of DLC layer systems can, in principle, be overall ensured by a high sp3 amount, a high e-modulus as well as a sufficiently thick adhesive layer.

The thermal stability can be further improved by doping [Wu, W. -J., Hon, M. -H., (1999). Surf. Coat. Technol., 111: 134-140.], by the crystal structure [Zhang, S., Bui, X. L., Li, X. (2006). Diamond and Related Materials 15: 972-976.] or by the production process [Jung, H. -S., Park, H. -H., Pang, S. S., Lee, S. Y., (1999) Thin Solid Films 355-356: 151-156.]. The ambient atmospheric conditions are also relevant [Ronkainen, H., Likonen, J., Koskinen, J., Varjus, S. (1986), Surf. Coat. Technol. 79: 87-94.].

In initial fired engine tests, the inventors determined that ta-C coatings in diesel applications on compression rings in the area of the end clearance already become detached after 100 h of run time and the functionality of the piston ring as regards its sealing behavior is therefore endangered, however, also the component lifespan (see FIG. 1). It was calculated from simulations that with diesel pistons, temperatures in the first groove of partly above 330° C. are reached. Accordingly, these temperatures are to be considered as critical although they are far below the maximum values for the thermal resistance of ta-C layers specified in the literature (up to 500° C. according to VDI guideline 2840).

SUMMARY

The invention is therefore based on the object of creating a sliding element which in particular is improved with regard to the thermal and/or thermochemical adhesion of the coating, in particular a piston ring having this property. In particular, a layer system on the basis of a DLC coating type is supposed to be provided which greatly raises the thermal resistance in motor applications such that the layers can withstand the mentioned maximum motor temperatures and have a consistent wear-resistance.

According thereto, it has a coating that comprises from the inside outwards the following layers: a polycrystalline, metal-containing adhesive layer, an intermediate layer, and at least one amorphous carbon layer. The intermediate layer thereby has from the inside outwards at least an $A_xC_y$ layer and a crystalline-containing or a crystal-containing or also a crystallite-containing carbon layer, with C standing for carbon, A standing for a metal, preferably of the metal-containing adhesive layer, and x as well y each comprising values of 1-99. The layer type of the amorphous carbon layers can thereby be chosen from the types provided in the VDI guideline 2840.

The invention is based on the understanding that the adhesive layer is polycrystalline, whilst the outer layer which owing to its function of consistently ensuring a low coefficient of friction is designated as a functional layer, is amorphous. In order to here ensure an advantageous transition and a good adhesion of all layers, the intermediate layer is firstly provided on the adhesive layer. The former has a comparatively thin, compact and oriented, partially texturized, crystal-containing structure, and therefore the stability is ensured and, in principle, possible diffusion processes within this layer as well as in the direction of the adhesive layer and in the direction of the functional layer are prevented. With the described layer structure, an improved thermal resistance and adhesion was able to be determined in the first experiments. The coating preferably occurs by means of the so-called PVD-Arc technology.

FIG. 2 shows an image of a coating structure according to the invention and illustrates that even after 300 h of motor runtime in the same motor as described in FIG. 1, the thermal stability of the sliding element described in patent claim 1 is given.

Preferably, the sliding element has between the $A_xC_y$ layer and the crystalline-containing or crystal-containing carbon layer a transition layer which is constituted by a mixed phase of the $A_xC_y$ layer and the crystalline-containing or crystal-containing carbon layer. Such a layer structure leads to an improved adhesion between the partial layers.

For the metal A of the $A_xC_y$ layer, preferably also the adhesive layer, e.g. titanium, tungsten, any transition metals and especially chromium are provided.

Moreover, good results are expected for nitrides and carbonitrides of the aforementioned metals in the adhesive layer.

It has moreover been found for the adhesive layer that it is supposed to have a thickness of more than 80 nm in order to sufficiently equalize mechanically or thermally caused transverse forces during use, i.e. to achieve the sliding element, in particular the piston ring base-material.

A thickness of 3 nm to 10 nm, preferably 4 nm to 8 nm, is currently preferred for the $A_xC_y$ layer.

For the crystalline-containing or crystal-containing carbon layer, it has been found that a thickness of ≤35 nm is advantageous.

The transition layer is preferably 1 to 25 nm thick in order to achieve the described advantageous effects.

For at least one amorphous carbon layer it is preferred that it is hydrogen-free and/or undoped (according to VDI guideline 2840 this means that the hydrogen content is ≤3 At %), since such kinds of layers have a higher wear resistance and lower coefficient of friction, particularly when used in internal combustion engines.

It is especially preferred that at least two amorphous carbon layers are provided, with it further being preferred that an inner amorphous carbon layer has a higher average e-modulus than an outer amorphous carbon layer. Within the outer carbon layer there can thereby be a continuous reduction of the e-modulus in order to harmonize the residual stresses within the entire C layer.

In particular, in a system having two amorphous carbon layers, an average e-modulus of E1 >300 GPa has proven to be favorable for the inner layer, since it can ensure the compactness described above.

For an outer amorphous carbon layer, an average e-modulus $E_2$ is currently preferred, with $E_2<E_1$. This allows shear forces to be elastically absorbed and, for example, improved run-in behavior to be achieved. Moreover, the e-modulus of the outer amorphous carbon layer can decrease from the inside outwards.

For an inner amorphous carbon layer, in other words preferably an amorphous carbon layer having a comparatively high e-modulus, it is currently preferred that its thickness is 5% to 30% of the total thickness.

For the total thickness, 1 μm to 50 μm has further been proven to be beneficial.

DETAILED DESCRIPTION

Figure 1:
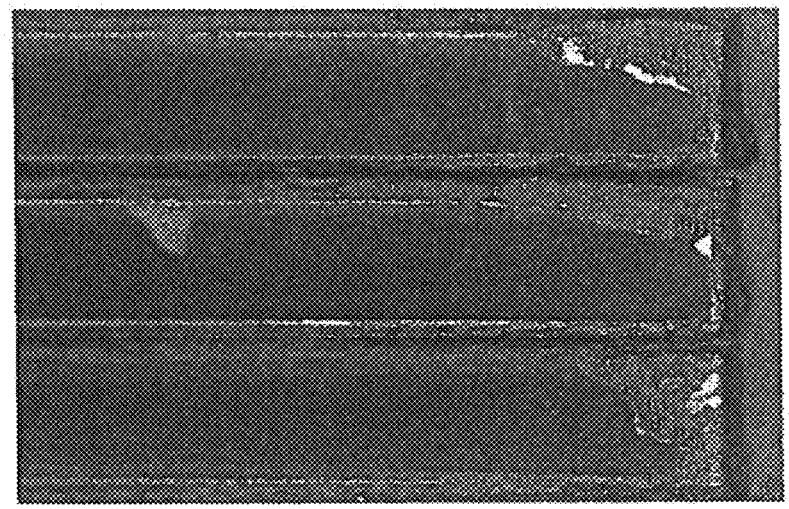
FIG. 1 shows the running surface damages of conventional ta-C coated piston rings at the end clearance after a 100 h high power motor run in a diesel motor.
Figure 2:
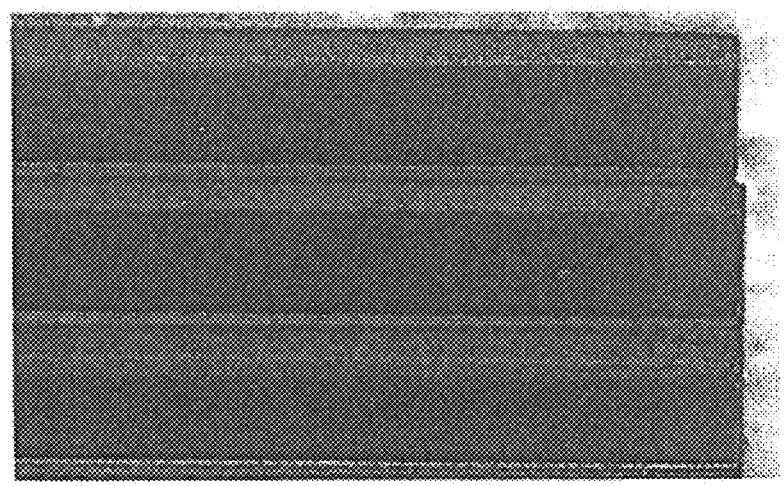
FIG. 2 shows an image of an end clearance of the piston ring coated with ta-C according to the invention at the end clearance after a 300 h motor run in a diesel motor.

Especially currently preferred is a layer structure from the inside outwards having an adhesive layer of chromium, an intermediate layer (consisting of a CrxCy layer, a mixed-phase transition layer of CrxCy layer and crystalline-containing or crystal-containing carbon layer and a crystalline-containing or crystal-containing carbon layer), and two hydrogen-free amorphous carbon layers with the partial layers having the layer thicknesses defined in claims 5 to 8.

Compared to a thinner adhesive layer and a thicker crystalline-containing or crystal-containing carbon layer in particular, a thermal stability of up to 50° C. higher in an oxygen-containing atmosphere was able to be determined for the preferred structure. Specifically, the adhesive layer of the comparative example had a thickness of <80 nm, and the crystalline-containing or crystal-containing carbon layer had a thickness of 40 nm to 60 nm.

A PVD-Arc method is to be advantageously used as a production process.

For example, the C-ions can penetrate the adhesive layer with high energy to produce a CrxCy layer that is only a few nanometers thick. For energy reasons, the C-ions not only penetrate the layer, but rather there is also the possibility that ions diffuse to the surface again and thereby form a first crystalline-containing or crystal-containing carbon layer. This effect is designated as subplantation and described in detail in the paper by J. Robertson (J. Robertson, Diamond-like amorphous carbon; Material Science and Engineering R37; 2002; 129-281).

This layer, which is brought about by high-energy C-ions, is referred to in this text as a crystalline-containing or a crystal-containing or also a crystallite containing carbon layer. The layer can be semi-crystalline (nc-graphite, i.e. individual randomly oriented clusters have formed) or crystalline (oriented cluster levels), with the carbon atoms being predominantly sp2 hybridized. The maximum expansion or extension of the cluster levels of a CrxCy layer is thereby approximately 100 nm. The distance between the cluster levels can be very small to the atomic level. Furthermore, the crystalline C-phases contained in the layer are on the nanoscale. What is brought about by the process parameters can be detected by the so-called Raman spectroscopy according to A. C. Ferrari and J. Robertson (Physical Review B; Vol 61; Number 20; 2000; 14095-14107). Electron-microscopic examinations of the coating according to the invention, in particular the intermediate layer, for example, by means of TEH and SAED ("Selected Area Electron Diffraction") show inter alia semi-elliptical reflexes in the diffraction image which correspond to graph reflexes. The presence of crystalline carbon in the carbon layer of the intermediate layer and its partial crystallinity can be deduced from this. In TEM bright field images of the intermediate layer discrete circles, which point to the cubic space-centered crystal lattice of Cr, and elliptical graph reflexes can be recognized. This further reveals the coexistence of crystalline Cr phases and crystalline C phases in the intermediate or transition layer of the coating of the sliding element according to the invention.

It was found that in the subsequent process in which the amorphous carbon layer is produced by the deposition of C-ions having lower energy, an excellent adhesion can be ensured if the intermediate layer according to the invention is provided between the adhesive layer and the amorphous carbon layer. In particular, if the crystalline-containing or crystal-containing carbon layer is too thick, transverse forces can no longer be absorbed since the crystal planes of the crystalline-containing or crystal-containing carbon layer grow at a preferred angle to the surface. Then the amorphous functional C-layer is detached from the crystalline-containing or crystal-containing carbon layer. Transverse forces can be caused by an external, mechanical force, for example, by an up and down movement of a piston ring in the cylinder of an internal combustion engine connected with a mixed or limiting frictional condition or by a thermal energy, which leads to stresses in the transition Fe-based substrate to carbon layer by strongly different coefficients of thermal expansion.

With the experiments regarding the layers mentioned here, a mixture of Cr and C to CrxCy as well CrxVy and the crystalline-containing or crystal-containing carbon layer was achieved by a strong acceleration of the C-ions. The acceleration is given by means of a high so-called BIAS voltage which is adjusted directly at the component. Temperatures that are too high cause the formation of C clusters, predominantly having sp2 bonds, preferably anisotropically distributed, through which, the stability of the transition is reduced. At temperatures <120° C., a more isotropic formation of crystal planes rich in sp2, the so-called nc graphite, occurs. These have a high thermal and mechanical stability.

Therefore, preferably temperatures of 30 to 120° C. and BIAS voltages of 500 to 1200V are to be kept to for the intermediate layer, whilst preferably temperatures of <250° C. and BIAS voltages of 10 to 200V are to be adjusted for the DLC functional layers. As is known to the skilled person, by adjusting the voltage and temperature in the above-mentioned parameter range, in particular the e-modulus curves according to the invention are also able to be adjusted.

All statements made for the Cr-based embodiment, example above regarding the properties and (nano) structure of the intermediate and transition layers in particular apply to all coatings comprised by the present invention.

The invention claimed is:

1. A sliding element, in the form of a piston ring, having a coating which has the following layers from the inside outwards:
   a polycrystalline, metal-containing adhesive layer,
   an intermediate layer, and
   at least one amorphous carbon layer,
   the intermediate layer having at least the following partial layers from the inside outwards:
   an AxCy layer, C standing for carbon, A standing for a transition metal, and x as well as y each comprising values of 1-99, and
   a crystalline-containing carbon layer, wherein the carbon atoms in the crystalline-containing carbon layer are predominantly $sp^2$ hybridized.

2. The sliding element according to claim 1, wherein the sliding element between the AxCy layer and the crystalline-containing carbon layer has a transition layer which is constituted by a mixed phase of the AxCy layer and the crystalline-containing carbon layer.

3. The sliding element according to claim 1, wherein the metal A is chosen from tungsten, titanium, and chromium.

4. The sliding element according claim 1, wherein the adhesive layer contains a nitride or carbonitride of a metal.

5. The sliding element according claim 1, wherein the adhesive layer has a thickness of more than 80 nm.

6. The sliding element according to claim 1, wherein the AxCy layer has a thickness of 3 nm to 10 nm.

7. The sliding element according to claim 6, wherein the AxCy layer has a thickness of 4 nm to 8 nm.

8. The sliding element according to claim 1, wherein the crystalline-containing carbon layer has a thickness of no more than 35 nm.

9. The sliding element according to claim 2, wherein the transition layer has a thickness of 1 to 25 nm.

10. The sliding element according to claim 1, wherein at least one amorphous carbon layer is hydrogen-free and/or undoped.

11. The sliding element according to claim 1, wherein at least two amorphous carbon layers are provided.

12. The sliding element according to claim 11, wherein an inner amorphous carbon layer has a higher e-modulus than an outer amorphous carbon layer.

13. The sliding element according to claim 11 wherein an inner amorphous carbon layer has an average e-modulus of more than 300 GPa.

14. The sliding element according to claim 11, wherein an outer amorphous carbon layer has an average e-modulus that is smaller than the e-modulus of the inner amorphous carbon layer.

15. The sliding element according to claim 11, wherein the e-modulus of the outer amorphous carbon layer decreases starting from the inner carbon layer in the direction of the surface.

16. The sliding element according to claim 11, wherein an inner amorphous carbon layer makes up 5% to 30% of the total thickness.

17. The sliding element according to claim 1, wherein the total thickness is 1 µm to 50 µm.

18. The sliding element according to claim 1, wherein the layers are produced by a PVD method.

19. The sliding element according to claim 1, wherein A is the metal of the metal-containing adhesive layer.

* * * * *